(12) United States Patent
Luukkala et al.

(10) Patent No.: US 8,799,239 B2
(45) Date of Patent: Aug. 5, 2014

(54) METHOD, APPARATUS AND COMPUTER PROGRAM PRODUCT FOR PERFORMING A QUERY USING A DECISION DIAGRAM

(75) Inventors: Vesa Luukkala, Espoo (FI); Jukka Honkola, Espoo (FI); Ian Oliver, Söderkulla (FI); Antti Lappetelainen, Espoo (FI); Juergen Ziegler, Espoo (FI)

(73) Assignee: Nokia Corporation, Espoo (FI)

( * ) Notice: Subject to any disclaimer, the term of this patent is extended or adjusted under 35 U.S.C. 154(b) by 1509 days.

(21) Appl. No.: 12/062,926

(22) Filed: Apr. 4, 2008

(65) Prior Publication Data

US 2009/0254513 A1    Oct. 8, 2009

(51) Int. Cl.
G06F 17/30    (2006.01)

(52) U.S. Cl.
CPC ............... *G06F 17/30153* (2013.01)
USPC .......................... 707/693; 707/720

(58) Field of Classification Search
USPC ................. 707/693, 719, 720, 722
See application file for complete search history.

(56) References Cited

U.S. PATENT DOCUMENTS 6,052,780 A * 4/2000 Glover .................... 713/193

OTHER PUBLICATIONS

Kieffer, et al., "Data Compression Via Binary Decision Diagrams", IEEE International Symposium on Information Theory, 2000, p. 296.*
Chen, Z. et al..; "An Algebraic Compression Framework for Query Results," available at http://www.ieeexplore.ieee.org/Xplore/login.jsp?url=/iel5/6778/18144/00839404.pdf.
Lai, Chung-Hung et al., "Compressing Inverted Files in Scalable Information Systems by Binary Decision Diagram Encoding," Department of Computer Science, National Chung Cheng University.

* cited by examiner

*Primary Examiner* — Robert Beausoliel, Jr.
*Assistant Examiner* — Nirav K Khakhar
(74) *Attorney, Agent, or Firm* — Alston & Bird LLP

(57) ABSTRACT

A method, apparatus and computer program product are provided for performing a query using a decision diagram. In this regard, in response to receiving a query instruction a compression value for a query result decision diagram can be determined. A compression value for a compressed query result set may also be determined. A compression ratio can be determined between the compression value for the query result decision diagram and the compression value for a compressed query result set. A query result decision diagram may be generated based on the query instruction and a relationship between the compression ratio and a threshold ratio. The query result decision diagram may also be transmitted based upon a relationship between the compression ratio and a threshold ratio.

25 Claims, 6 Drawing Sheets

METHOD, APPARATUS AND COMPUTER PROGRAM PRODUCT FOR PERFORMING A QUERY USING A DECISION DIAGRAM

FIELD OF THE INVENTION

Embodiments of the present invention relate generally to performing queries and, more particularly, relate to an apparatus, method, and a computer program product for performing a query using a decision diagram.

BACKGROUND OF THE INVENTION

The modern communications era has brought about a tremendous expansion of wireline and wireless networks. Computer networks, television networks, and telephony networks are experiencing an unprecedented technological expansion, fueled by consumer demand. This expansion of networks, and connectivity to data storage devices, has made remarkable quantities of information available to users of computers and mobile communications devices.

The expansion of these communications networks has accordingly fostered increased utilization of the networks. As utilization of communications networks increase, the communications channels of the networks can become increasingly congested. Congestion can result in latency in data delivery and reception, and an overall poor quality of service. To rectify these congestion problems, owners and operators of networks are forced to decide whether to spend additional capital to gain access to more bandwidth, or find ways to reduce traffic on the existing channels in a manner that also maintains a level of service acceptable to users. Since spending capital is typically not the favored solution, it is desirable to identify mechanisms for reducing communications traffic without generating a noticeable effect on the users of the network.

One particular type of network traffic that has substantially increased congestion on network channels is search queries used to locate data and the results of search queries. As users continue to increase their reliance on data retrieved from networks, an increasing number of queries used to find and retrieve data are being generated. Not only do queries increase traffic when sent to, for example, a search server, the returned results of the queries also generate substantial congestion.

Accordingly, it would be desirable to identify mechanisms that reduce communications traffic on networks. Further, it would be desirable to identify mechanisms that not only reduce data communications traffic but also provide users with the same or better level of service as provided in the absence of such mechanisms. In particular, networks can benefit from mechanisms that reduce the communications traffic associated with search queries, and the results of search queries, in a manner that is not detrimental to the quality of service currently provided to users.

BRIEF SUMMARY OF THE INVENTION

A method, apparatus and computer program product are provided for performing a query using a decision diagram. In this regard, in response to receiving a query instruction, a compression value for a query result decision diagram can be determined. A compression value for a compressed query result set may also be determined. A compression ratio can be determined between the compression value for the query result decision diagram and the compression value for a compressed query result set. A query result decision diagram may be generated based on the query instruction and a relationship between the compression ratio and a threshold ratio. A timer may also be started when either the generation query result decision diagram is complete or when generation of a compressed query result set is complete. The query result decision diagram may also be transmitted based upon a relationship between the compression ratio and a threshold ratio. In some embodiments, transmission of the query result decision diagram may be additionally, or alternatively, based on a relationship between the timer and a timer threshold.

In one exemplary embodiment, a method for performing a query using a decision diagram is provided. The method may include receiving a first query instruction, determining a compression ratio between a compression value for a first query result decision diagram and a compression value for a compressed query result set, and providing for the transmission of the first query result decision diagram based upon a relationship between the compression ratio and a threshold ratio.

In another exemplary embodiment, a computer program product for performing a query using a decision diagram is provided. The computer program product may include at least one computer-readable storage medium having computer-readable, executable program code portions stored therein. The computer-readable program code portions may include a first program code portion, a second program code portion, and a third program code portion. The first program code portion may be for receiving a first query instruction. The second program code portion may be for determining a compression ratio between a compression value for a first query result decision diagram and a compression value for a compressed query result set. The third program code portion may be for providing for the transmission of the first query result decision diagram based upon a relationship between the compression ratio and a threshold ratio.

In another exemplary embodiment, an apparatus for performing a query using a decision diagram is provided. The apparatus may include a processor. The processor may be configured to receive a first query instruction, determine a compression ratio between a compression value for a first query result decision diagram and a compression value for a compressed query result set, and provide for transmission of the first query result decision diagram based upon a relationship between the compression ratio and a threshold ratio.

In another exemplary embodiment, an apparatus for performing a query using a decision diagram is provided. The apparatus may include means for receiving a query instruction, means for determining a compression ratio between a compression value for a query result decision diagram and a compression value for a compressed query result set, and means for transmitting the query result decision diagram based upon a relationship between the compression ratio and a threshold ratio.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Figure 1:
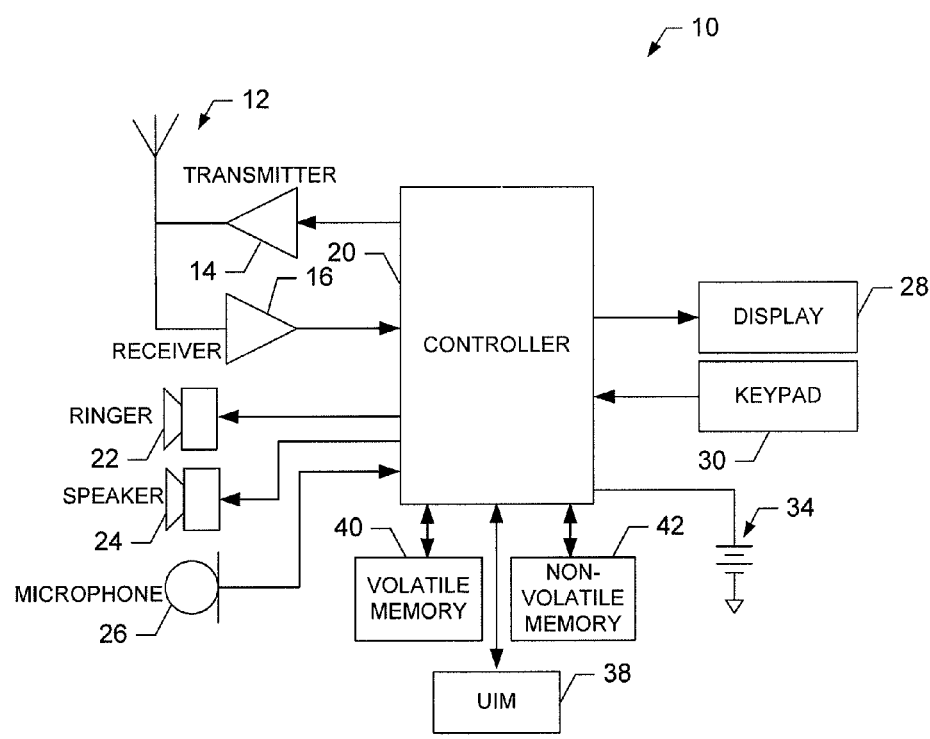
FIG. 1 is a schematic block diagram of a mobile terminal according to an exemplary embodiment of the present invention.

Embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

FIG. 1, one aspect of the invention, illustrates a block diagram of a mobile terminal 10 that would benefit from embodiments of the present invention. It should be understood, however, that a mobile telephone as illustrated and hereinafter described is merely illustrative of one type of mobile terminal that would benefit from embodiments of the present invention and, therefore, should not be taken to limit the scope of embodiments of the present invention. While several embodiments of the mobile terminal 10 are illustrated and will be hereinafter described for purposes of example, other types of mobile terminals, such as portable digital assistants (PDAs), pagers, mobile televisions, gaming devices, laptop computers, cameras, video recorders, audio/video player, radio, GPS devices, or any combination of the aforementioned, and other types of voice and text communications systems, can readily employ embodiments of the present invention.

In addition, while several embodiments of the method of the present invention are performed or used by a mobile terminal 10, the method may be employed by other than a mobile terminal. Moreover, the system and method of embodiments of the present invention will be primarily described in conjunction with mobile communications applications. It should be understood, however, that the system and method of embodiments of the present invention can be utilized in conjunction with a variety of other applications, both in the mobile communications industries and outside of the mobile communications industries.

The mobile terminal 10 may include an antenna 12 (or multiple antennas) in operable communication with a transmitter 14 and a receiver 16. The mobile terminal 10 may further include an apparatus, such as a controller 20 or other processing element, that provides signals to and receives signals from the transmitter 14 and receiver 16, respectively. The signals include signaling information in accordance with the air interface standard of the applicable cellular system, and also user speech, received data and/or user generated data. In this regard, the mobile terminal 10 is capable of operating with one or more air interface standards, communication protocols, modulation types, and access types. By way of illustration, the mobile terminal 10 is capable of operating in accordance with any of a number of first, second, third and/or fourth-generation communication protocols or the like. For example, the mobile terminal 10 may be capable of operating in accordance with second-generation (2G) wireless communication protocols IS-136 (time division multiple access (TDMA)), GSM (global system for mobile communication), and IS-95 (code division multiple access (CDMA)), or with third-generation (3G) wireless communication protocols, such as Universal Mobile Telecommunications System (UMTS), CDMA2000, wideband CDMA (WCDMA) and time division-synchronous CDMA (TD-SCDMA), with fourth-generation (4G) wireless communication protocols or the like. As an alternative (or additionally), the mobile terminal 10 may be capable of operating in accordance with non-cellular communication mechanisms. For example, the mobile terminal 10 may be capable of communication in a wireless local area network (WLAN) or other communication networks described below in connection with FIG. 2.

It is understood that the apparatus, such as the controller 20, may include circuitry desirable for implementing audio and logic functions of the mobile terminal 10. For example, the controller 20 may be comprised of a digital signal processor device, a microprocessor device, and various analog to digital converters, digital to analog converters, and other support circuits. Control and signal processing functions of the mobile terminal 10 are allocated between these devices according to their respective capabilities. The controller 20 thus may also include the functionality to convolutionally encode and interleave message and data prior to modulation and transmission. The controller 20 can additionally include an internal voice coder, and may include an internal data modem. Further, the controller 20 may include functionality to operate one or more software programs, which may be stored in memory. For example, the controller 20 may be capable of operating a connectivity program, such as a conventional Web browser. The connectivity program may then allow the mobile terminal 10 to transmit and receive Web content, such as location-based content and/or other web page content, according to a Wireless Application Protocol (WAP), Hypertext Transfer Protocol (HTTP) and/or the like, for example.

The mobile terminal 10 may also comprise a user interface including an output device such as a conventional earphone or speaker 24, a ringer 22, a microphone 26, a display 28, and a user input interface, all of which are coupled to the controller 20. The user input interface, which allows the mobile terminal 10 to receive data, may include any of a number of devices allowing the mobile terminal 10 to receive data, such as a keypad 30, a touch display (not shown) or other input device. In embodiments including the keypad 30, the keypad 30 may include the conventional numeric (0-9) and related keys (#, *), and other hard and soft keys used for operating the mobile terminal 10. Alternatively, the keypad 30 may include a conventional QWERTY keypad arrangement. The keypad 30 may also include various soft keys with associated functions. In addition, or alternatively, the mobile terminal 10 may include an interface device such as a joystick or other user input interface. The mobile terminal 10 further includes a battery 34, such as a vibrating battery pack, for powering various circuits that are required to operate the mobile terminal 10, as well as optionally providing mechanical vibration as a detectable output.

The mobile terminal 10 may further include a user identity module (UIM) 38. The UIM 38 is typically a memory device having a processor built in. The UIM 38 may include, for example, a subscriber identity module (SIM), a universal integrated circuit card (UICC), a universal subscriber identity module (USIM), a removable user identity module (R-UIM), etc. The UIM 38 typically stores information elements related to a mobile subscriber. In addition to the UIM 38, the mobile terminal 10 may be equipped with memory. For example, the mobile terminal 10 may include volatile memory 40, such as volatile Random Access Memory (RAM) including a cache area for the temporary storage of data. The mobile terminal 10 may also include other non-volatile memory 42, which can be embedded and/or may be removable. The non-volatile memory 42 can additionally or alternatively comprise an electrically erasable programmable read only memory (EE-PROM), flash memory or the like, such as that available from the SanDisk Corporation of Sunnyvale, Calif., or Lexar Media Inc. of Fremont, Calif. The memories can store any of a number of pieces of information, and data, used by the mobile terminal 10 to implement the functions of the mobile terminal 10. For example, the memories can include an identifier, such as an international mobile equipment identification (IMEI) code, capable of uniquely identifying the mobile terminal 10. Furthermore, the memories may store instructions for determining cell id information. Specifically, the memories may store an application program for execution by the controller 20, which determines an identity of the current cell, i.e., cell id identity or cell id information, with which the mobile terminal 10 is in communication.

Figure 2:
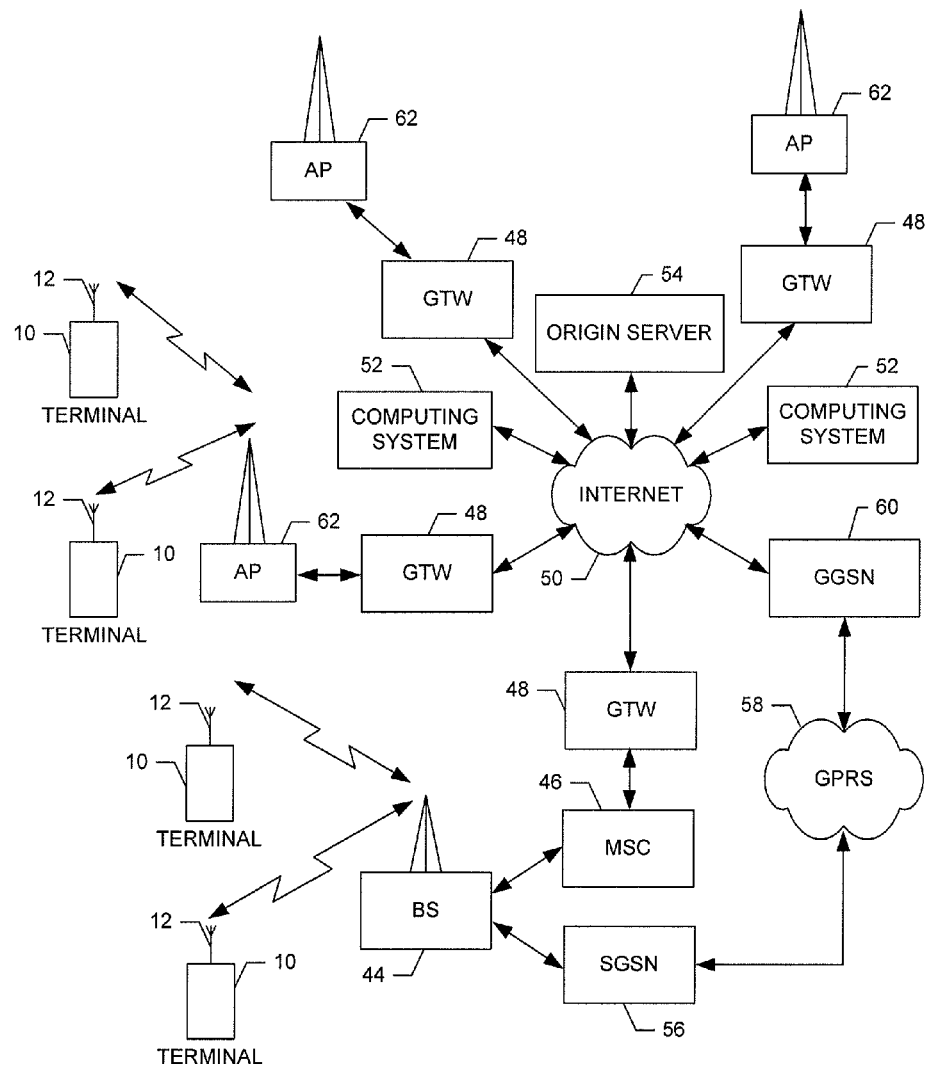
FIG. 2 is a schematic block diagram of a wireless communications system according to an exemplary embodiment of the present invention.

FIG. 2 is a schematic block diagram of a wireless communications system according to an exemplary embodiment of the present invention. Referring now to FIG. 2, an illustration of one type of system that would benefit from embodiments of the present invention is provided. The system includes a plurality of network devices. As shown, one or more mobile terminals 10 may each include an antenna 12 for transmitting signals to and for receiving signals from a base site or base station (BS) 44. The base station 44 may be a part of one or more cellular or mobile networks each of which includes elements required to operate the network, such as a mobile switching center (MSC) 46. As well known to those skilled in the art, the mobile network may also be referred to as a Base Station/MSC/Interworking function (BMI). In operation, the MSC 46 is capable of routing calls to and from the mobile terminal 10 when the mobile terminal 10 is making and receiving calls. The MSC 46 can also provide a connection to landline trunks when the mobile terminal 10 is involved in a call. In addition, the MSC 46 can be capable of controlling the forwarding of messages to and from the mobile terminal 10, and can also control the forwarding of messages for the mobile terminal 10 to and from a messaging center. It should be noted that although the MSC 46 is shown in the system of FIG. 2, the MSC 46 is merely an exemplary network device and embodiments of the present invention are not limited to use in a network employing an MSC.

The MSC 46 can be coupled to a data network, such as a local area network (LAN), a metropolitan area network (MAN), and/or a wide area network (WAN). The MSC 46 can be directly coupled to the data network. In one typical embodiment, however, the MSC 46 is coupled to a gateway device (GTW) 48, and the GTW 48 is coupled to a WAN, such as the Internet 50. In turn, devices such as processing elements (e.g., personal computers, server computers or the like) can be coupled to the mobile terminal 10 via the Internet 50. For example, as explained below, the processing elements can include one or more processing elements associated with a computing system 52 (two shown in FIG. 2), origin server 54 (one shown in FIG. 2) or the like, as described below.

The BS 44 can also be coupled to a serving GPRS (General Packet Radio Service) support node (SGSN) 56. As known to those skilled in the art, the SGSN 56 is typically capable of performing functions similar to the MSC 46 for packet switched services. The SGSN 56, like the MSC 46, can be coupled to a data network, such as the Internet 50. The SGSN 56 can be directly coupled to the data network. In a more typical embodiment, however, the SGSN 56 is coupled to a packet-switched core network, such as a GPRS core network 58. The packet-switched core network is then coupled to another GTW 48, such as a gateway GPRS support node (GGSN) 60, and the GGSN 60 is coupled to the Internet 50. In addition to the GGSN 60, the packet-switched core network can also be coupled to a GTW 48. Also, the GGSN 60 can be coupled to a messaging center. In this regard, the GGSN 60 and the SGSN 56, like the MSC 46, may be capable of controlling the forwarding of messages, such as MMS messages. The GGSN 60 and SGSN 56 may also be capable of controlling the forwarding of messages for the mobile terminal 10 to and from the messaging center.

In addition, by coupling the SGSN 56 to the GPRS core network 58 and the GGSN 60, devices such as a computing system 52 and/or origin server 54 may be coupled to the mobile terminal 10 via the Internet 50, SGSN 56 and GGSN 60. In this regard, devices such as the computing system 52 and/or origin server 54 may communicate with the mobile terminal 10 across the SGSN 56, GPRS core network 58 and the GGSN 60. By directly or indirectly connecting mobile terminals 10 and the other devices (e.g., computing system 52, origin server 54, etc.) to the Internet 50, the mobile terminals 10 may communicate with the other devices and with one another, such as according to the Hypertext Transfer Protocol (HTTP) and/or the like, to thereby carry out various functions of the mobile terminals 10.

Although not every element of every possible mobile network is shown and described herein, it should be appreciated that the mobile terminal 10 may be coupled to one or more of any of a number of different networks through the BS 44. In this regard, the network(s) may be capable of supporting communication in accordance with any one or more of a number of first-generation (1G), second-generation (2G), 2.5G, third-generation (3G), 3.9G, fourth-generation (4G) mobile communication protocols or the like. For example, one or more of the network(s) can be capable of supporting communication in accordance with 2G wireless communication protocols IS-136 (TDMA), GSM, and IS-95 (CDMA). Also, for example, one or more of the network(s) can be capable of supporting communication in accordance with 2.5G wireless communication protocols GPRS, Enhanced Data GSM Environment (EDGE), or the like. Further, for example, one or more of the network(s) can be capable of supporting communication in accordance with 3G wireless communication protocols such as a UMTS network employing WCDMA radio access technology. Some narrow-band analog mobile phone service (NAMPS), as well as total access communication system (TACS), network(s) may also benefit from embodiments of the present invention, as should dual or higher mode mobile stations (e.g., digital/analog or TDMA/CDMA/analog phones).

The mobile terminal 10 can further be coupled to one or more wireless access points (APs) 62. The APs 62 may comprise access points configured to communicate with the mobile terminal 10 in accordance with techniques such as, for example, radio frequency (RF), infrared (IrDA) or any of a number of different wireless networking techniques, including WLAN techniques such as IEEE 802.11 (e.g., 802.11a, 802.11b, 802.11g, 802.11n, etc.), world interoperability for microwave access (WiMAX) techniques such as IEEE 802.16, and/or wireless Personal Area Network (WPAN) techniques such as IEEE 802.15, BlueTooth (BT), ultra wideband (UWB) and/or the like. The APs 62 may be coupled to the Internet 50. Like with the MSC 46, the APs 62 can be directly coupled to the Internet 50. In one embodiment, however, the APs 62 are indirectly coupled to the Internet 50 via a GTW 48. Furthermore, in one embodiment, the BS 44 may be considered as another AP 62. As will be appreciated, by directly or indirectly connecting the mobile terminals 10 and the computing system 52, the origin server 54, and/or any of a number of other devices, to the Internet 50, the mobile terminals 10 can communicate with one another, the computing system, etc., to thereby carry out various functions of the mobile terminals 10, such as to transmit data, content or the like to, and/or receive content, data or the like from, the computing system 52. As used herein, the terms "data," "content," "information" and similar terms may be used interchangeably to refer to data capable of being transmitted, received and/or stored in accordance with embodiments of the present invention. Thus, use of any such terms should not be taken to limit the spirit and scope of embodiments of the present invention.

Although not shown in FIG. 2, in addition to or in lieu of coupling the mobile terminal 10 to computing systems 52 across the Internet 50, the mobile terminal 10 and computing system 52 may be coupled to one another and communicate in accordance with, for example, RF, BT, IrDA or any of a number of different wireline or wireless communication techniques, including LAN, WLAN, WiMAX, UWB techniques and/or the like. One or more of the computing systems 52 can additionally, or alternatively, include a removable memory capable of storing content, which can thereafter be transferred to the mobile terminal 10. Further, the mobile terminal 10 can be coupled to one or more electronic devices, such as printers, digital projectors and/or other multimedia capturing, producing and/or storing devices (e.g., other terminals). Like with the computing systems 52, the mobile terminal 10 may be configured to communicate with the portable electronic devices in accordance with techniques such as, for example, RF, BT, IrDA or any of a number of different wireline or wireless communication techniques, including universal serial bus (USB), LAN, WLAN, WiMAX, UWB techniques and/or the like.

In an exemplary embodiment, content or data may be communicated over the system of FIG. 2 between a mobile terminal, which may be similar to the mobile terminal 10 of FIG. 1, and a network device of the system of FIG. 2 in order to, for example, execute applications or establish communication (for example, for purposes of content or information sharing) between the mobile terminal 10 and other mobile terminals. As such, it should be understood that the system of FIG. 2 need not be employed for communication between mobile terminals or between a network device and the mobile terminal, but rather FIG. 2 is merely provided for purposes of example. Furthermore, it should be understood that embodiments of the present invention may be resident on a communication device such as the mobile terminal 10, and/or may be resident on a server, personal computer or other device, absent any communication with the system of FIG. 2.

An exemplary embodiment of the invention will now be described with reference to FIG. 3, in which certain elements of an apparatus for performing a query using a decision diagram are displayed. The apparatus 300 of FIG. 3 may be embodied as or otherwise employed, for example, on a network device such as a server of FIG. 2. In some embodiments, apparatus 300 may be an information store such as an Resource Description Frame (RDF) store in a smart space or other area that allows connectivity to mobile terminals that may come into range of the area. However, it should be noted that the apparatus 300 of FIG. 3, may also be employed on a variety of other devices, both mobile (e.g., the mobile terminal 10) and fixed, and therefore, the present invention should not be limited to application on devices such as servers. It should also be noted that while FIG. 3 illustrates one example of a configuration of an apparatus 300 for performing a query using a decision diagram, numerous other configurations may also be used to implement embodiments of the present invention.

Figure 3:
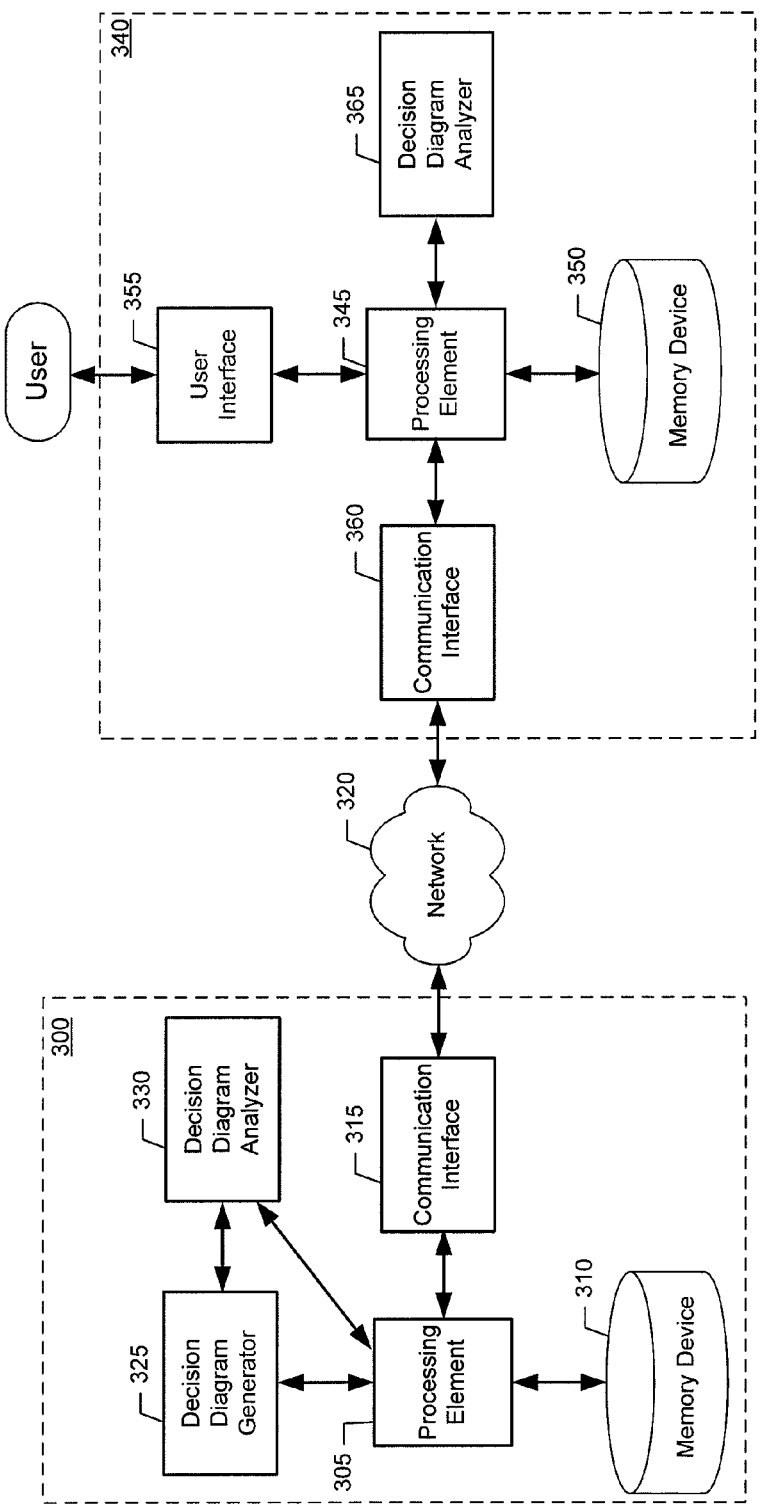
FIG. 3 illustrates a block diagram showing an apparatus for performing a query using a decision diagram according to an exemplary embodiment of the present invention.

Referring now to FIG. 3, an apparatus 300 for performing a query using a decision diagram is provided. The apparatus 300 may include or otherwise be in communication with a processing element 305, a communication interface 315, and a memory device 310. The memory device 310 may include, for example, volatile and/or non-volatile memory (e.g., volatile memory 40 and/or non-volatile memory 42). The memory device 310 may be configured to store information, data, applications, instructions or the like for enabling the apparatus 300 to carry out various functions in accordance with exemplary embodiments of the present invention. For example, the memory device 310 could be configured to buffer input data for processing by the processing element 305. Additionally or alternatively, the memory device 310 could be configured to store instructions for execution by the processing element 305. As yet another alternative, the memory device 310 may be one of a plurality of databases that store information in the form of static and/or dynamic information.

The processing element 305 may be embodied in a number of different ways. For example, the processing element 305 may be embodied as a processor, a coprocessor, a controller or various other processing means or devices including integrated circuits such as, for example, an ASIC (application specific integrated circuit) or FPGA (field programmable gate array). In an exemplary embodiment, the processing element 305 may be configured to execute instructions stored in the memory device 305 or otherwise accessible to the processing element 305.

The communication interface 315 may be embodied as any device or means embodied in either hardware, software, or a combination of hardware and software that is configured to receive and/or transmit data from/to a network and/or any other device or module in communication with the apparatus 300. In this regard, the communication interface 315 may include, for example, an antenna and supporting hardware and/or software for enabling communications with network 320, which may be any type of wired or wireless network. Via communication interface 315 and network 320, apparatus 300 can be in communication with exemplary apparatus 340, which, in some exemplary embodiments, also includes various aspects of the present invention.

In an exemplary embodiment, the processing element 305 may be embodied as or otherwise control a decision diagram generator 325. The decision diagram generator 325 may be any means or device embodied in hardware, software, or a combination of hardware and software that is configured to carry out the functions of the decision diagram generator 325 as described herein. In this regard, for example, the decision diagram generator 325 (which in an exemplary embodiment may be embodied at a server or other network device) may be configured to receive query instructions, determine a compression ratio with respect to a query result decision diagram, generate a query result decision diagram based upon the compression ratio, and provide for transmission of the query result decision diagram based upon the compression ratio.

Various aspects of the operation of decision diagram generator 325 relate to the generation and utilization of decision diagrams. A decision diagram may be a means of organizing data into a tree-type data structure that permits identification of a result by traversing various branches of the structure. Various known ways of organizing data into a tree-type data structure may be used in aspects of the present invention. According to some embodiments of the present invention, decision diagrams may be binary decision diagrams (BDD) or reduced order binary decision diagrams (ROBDD). In this regard, exemplary decision diagrams according to various embodiments of the present invention are depicted in FIGS. 4a and 4b.

Figure 4A:
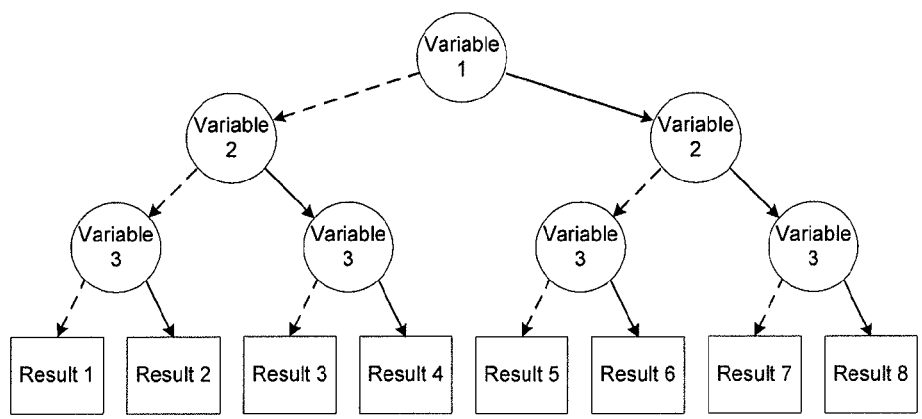
FIGS. 4a and 4b illustrate exemplary decision diagrams according to an exemplary embodiment of the present invention.
Figure 4B:
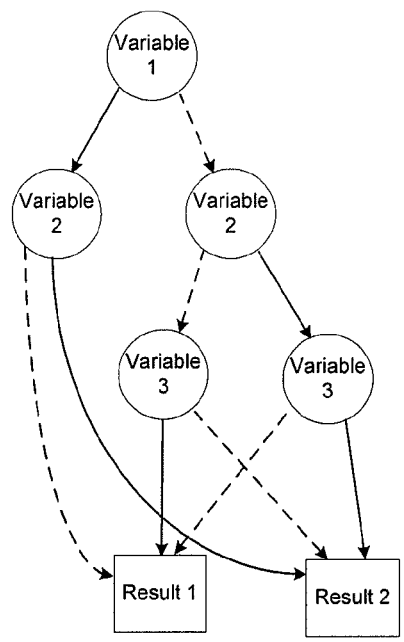

The exemplary decision diagram of FIG. 4a may be a BDD where three variables may be used to determine eight results. The variables of the diagram may be binary variables. As such, the tree may be traversed toward a result using two paths from each variable. In this exemplary embodiment, if a variable is set to zero then the path depicted by a dotted line may be traversed. Alternatively, if a variable is set to one, then the solid line path may be traversed. FIG. 4b is an illustration of an exemplary ROBDD. The ROBDD of FIG. 4b may be a reduced version of the decision diagram of FIG. 4a, where the eight results are reduced to only two results. Various known means may be used for simplifying decision diagrams. As such, a simplified or reduced diagram can be used to determine the results.

The use of decision diagrams in querying functions can have various advantages. For example, in some instances when query result data is converted into a decision diagram, some compression of the query result data can occur via, for example, reduction or simplification. An additional advantage with respect to querying, may be that once a set of results is organized as a decision diagram, further queries against the earlier results, i.e. refining or narrowing queries, can be accomplished using computationally inexpensive logical operations against the existing decision diagram. As such, in some instances, it may be beneficial to perform queries against decision diagrams.

Referring now to the decision diagram generator 325 of FIG. 1, decision diagram generator 325 may receive instructions to perform a query. Decision diagram generator 325 may receive the instructions from a querying device such as, for example, apparatus 340 via network 320. The query instruction may include various criteria for desired data. In response to receipt of the query instruction, decision diagram generator 325 may access data in memory device 310 with respect to the criteria of the query instruction.

Decision diagram generator 325 may access data in memory device 310 that meets the criteria of the query instruction to determine compression values. A compression value may be the data size, i.e., data bit size, or various other data measurement size, that corresponds with a particular organization of query result data.

A decision diagram compression value, i.e., the data size of a decision diagram based on the query result data, may be determined by considering the data size of the query result data, if the query result data was organized into a decision diagram, such as a BDD or a ROBDD. The decision diagram compression value may be determined by generating a query result decision diagram, as described below, and measuring the data size of the query result decision diagram, or by applying an algorithm to the identified query result data which may predict the size of a query result decision diagram generated based on the query result data. In some embodiments, the data size of a dictionary associated with a query result decision diagram, which is described in further detail below, may also be included in the decision diagram compression value.

A compression value may also be determined for the query result data if various other known ways of compressing data were utilized such as Lempel-Ziv (LZ), or LZ-Renau (LZR). These compression values may be determined by actually performing the compression on the query result data and measuring the data size, or by applying algorithms that may predict the compression value with respect to the identified query data to generate a data size for a compressed query result set.

In an exemplary embodiment, the compression of a query result decision diagram may be calculated in the following manner. If a query includes N results, and each result is encoded with M bits, the uncompressed result set is (M*N) bits. This set of bits can be compressed by conventional means (for example, by concatenating all the bits to a bit string and compressing the bit string) to yield a size of X. For this conventional compression we can say that each solution is represented by X/N bits/solution. In this regard, for example, the (M*N) bits of the uncompressed result set can be represented by a ROBDD generated as described herein. In this regard, an ROBDD rendered as a sequence of bits (for example as a file) with size Y. For this exemplary ROBDD representation each solution may be represented by Y/N bits/solution.

A compression ratio may then be determined between the decision diagram compression value and a compression value for a selected known means for compressing the query result data. For example, a decision diagram compression value may be 1.2 kilobytes and a compression value using a selected known compression algorithm may be 1.5 kilobytes. As such the exemplary compression ratio may be 1 to 1.25.

Based on the compression ratio, decision diagram generator 325 may consider various options regarding how to proceed in performing the query. In this regard, decision diagram generator 325 may compare the compression ratio to a threshold value. In some embodiments, if comparison of the compression ratio to the threshold value indicates that the data size of the query result decision diagram is less than, by a predefined amount, the data size of the query result data that is compressed using a conventional compression method, then decision diagram generator 325 may proceed with generation and transmission of a query result decision diagram. In this regard, the threshold value and the predefined offset amount may be determined by taking into consideration computational capabilities, memory constraints, and communication congestion. Further, in some embodiments, if comparison of the compression ratio to the threshold value indicates that the data size of the query result decision diagram exceeds, by a predefined amount, the data size of the query result data that is compressed using a conventional compression method, then decision diagram generator 325 may provide for the query result data to be compressed using the conventional compression means, and the conventionally compressed version of the query result data may be transmitted.

Additionally, or alternatively to generating the compression ratio, decision diagram generator 325 may implement a timer to determine options for proceeding in performing a query. In this regard, decision diagram generator 325 may initialize (set the timer to a predetermined value) and start the timer when a compression value is determined for either the query result decision diagram or the conventional means of compressing data. In other words, the timer may be initialized and started when one compression value is known and the other compression value remains unknown. A timer threshold can be set, and when the timer has a particular relationship with respect to the timer threshold (e.g., the timer reaches, exceeds, or falls below the timer threshold), decision diagram generator 325 may consider various options regarding how to proceed in performing the query. In various embodiments, based on the comparison between the timer and the timer threshold, the process of determining the unknown compression value can be halted. In some embodiments, the query result decision diagram may be generated if the compression value is known for the query result decision diagram, and a particular relationship between the timer and the timer threshold has occurred. In other embodiments, the conventional compression of the query results may be generated and transmitted if the compression value is known for the conventional compression, and a particular relationship between the timer and the timer threshold has occurred. In yet other embodiments, the compression ratio may be set based on the comparison between the timer and the timer threshold. In this regard, the compression ratio may be set such that the compression ratio would indicate a poor compression value (i.e., little or no compression) for the unknown compression value.

With respect to the use of the timer, consider, for example, a situation where the compression value for a conventional compression has been determined. The timer may be initialized and started while determination of the compression value for the query result decision diagram is being calculated. If the query is complex and determination of the compression value for the query result decision diagram involves actually generating the query result decision diagram, the time required to determine the compression value for the query result decision diagram may be relatively lengthy. As such, when, for example, the timer exceeds the timer threshold, decision diagram generator 325 may proceed by generating and transmitting the query results that have been compressed via a conventional means.

In embodiments where, based upon a relationship between the compression ratio and a threshold value, the query result decision diagram is to be generated, as described above, decision diagram generator 325 may identify data held in memory device 310 that matches criteria associated with the query instruction. In various embodiments, the identified data may be encoded into binary sequences to facilitate generation of a decision diagram.

Encoding may include associating bit sequences with characters or other expressions in target data. For example, in some embodiments, data may be stored as triples, such as in a RDF environment. An exemplary set of stored triples may be "a,b,c" where "a" is encoded to be "101," "b" is encoded to be "001," and "c" is encoded to be "011." This set can then be concatenated to generate a bit sequence, which may be a query result bit sequence. In this regard, encoding keys, i.e., a=101, b=001, and c=011, can be stored in a dictionary as described further herein. In some embodiments, the number of bits used for encoding may be calculated based upon the size of an associated alphabet. In other embodiments, the number of bits used for encoding may be a set value such as 32 or 64 bits. After encoding the identified results, decision diagram generator 325 may generate a query result decision diagram directly from the identified, encoded data. This can be accomplished by performing logical- or operations with each bit sequence associated with a query result. Various known means may be used to generate the decision diagram into decision diagrams taking the form of, for example, a BDD or an ROBDD.

Alternatively, in some embodiments, prior to, or in response to, receiving a query instruction, all or some of the searchable data in memory device 310 may be encoded as described above, and a decision diagram for all the searchable data, i.e., an information store decision diagram, can be generated. In this regard, the information store decision diagram may be updated as new data is stored in memory device 310. Further, in some embodiments, the information store decision diagram may include commonly queried data, recently queried data, or some other subset of all the searchable data in memory device 310. Upon receiving the query instruction, a query result decision diagram may be generated from the information store decision diagram. The query result decision diagram may be developed by mapping the query criteria to the information store decision diagram using logic operations. In some embodiments, due to the architecture of the information store decision diagram, logical operations can be used to extract out the portions of the information store decision diagram to generate the query result decision diagram. In this regard, the query result decision diagram can be extracted from the information store decision diagram by using, for example, logical- and operations.

Generating the information store decision diagram, as described above, may be computationally expensive when compared to other methods. However, by generating the information store decision diagram prior to receipt of the query instruction, the computation used in response to the query instruction may be relatively inexpensive. In this regard, logical operations performed in response the query instruction may be relatively, computationally inexpensive and a query result decision diagram may be readily realized.

In addition to generating a query result decision diagram, a dictionary including encoding keys can be generated. As described above, to facilitate generation of the query result decision diagram, the query result data may be encoded. In conjunction with the encoding process, the dictionary may be generated. The dictionary can be used by a querying device to decode the query result data from the query result decision diagram. In some embodiments, the dictionary may be generated such that only the encoding keys for characters or expressions contained within the query result decision diagram are included.

In some embodiments, the dictionary may also be filtered. In this regard, the data of the dictionary may be altered by a filter to generate an alternative version of the dictionary. Through the use of a filter on the dictionary, a form of security or encryption may be enabled with regard to the decision diagram. The querying device may also include a means to filter the dictionary back to the original state.

Upon generation of the query result decision diagram, decision diagram generator 325 may provide for transmitting the query result decision diagram. In some embodiments, the dictionary may also be transmitted with the query result decision diagram. In this regard, if a prior dictionary was sent to a querying device, and the current dictionary is a subset of the prior dictionary, transmission of the dictionary may be omitted. Further, in some embodiments the query result decision diagram may be transmitted by apparatus 300 via communication interface 315 and network 320 to apparatus 340. In some embodiments, where apparatus 300 is the querying device, decision diagram generator 345 may transmit the query result decision diagram internally to decision diagram analyzer 330.

Apparatus 340 is an exemplary embodiment of the invention that will be described with reference to FIG. 3. Apparatus 340 includes certain elements for performing a query using a decision diagram. The apparatus 340 of FIG. 3 may be embodied as or otherwise employed, for example, on a network device such as a server of FIG. 2. However, it should be noted that the apparatus 340 of FIG. 3, may also be employed on a variety of other devices, both mobile (e.g., the mobile terminal 10) and fixed, and therefore, the present invention should not be limited to application on devices such as servers. It should also be noted that while FIG. 3 illustrates one example of a configuration of an apparatus 340 for performing a query using a decision diagram, numerous other configurations may also be used to implement embodiments of the present invention.

Referring now to FIG. 3, an apparatus 340 for performing a query using a decision diagram is provided. The apparatus 340 may include or otherwise be in communication with a processing element 345, a user interface 355, a communication interface 360, and a memory device 350. The memory device 350 may include, for example, volatile and/or non-volatile memory (e.g., volatile memory 40 and/or non-volatile memory 42). The memory device 350 may be configured to store information, data, applications, instructions or the like for enabling the apparatus to carry out various functions in accordance with exemplary embodiments of the present invention. For example, the memory device 350 could be configured to buffer input data for processing by the processing element 345. Additionally or alternatively, the memory device 350 could be configured to store instructions for execution by the processing element 345. As yet another alternative, the memory device 350 may be one of a plurality of databases that store information in the form of static and/or dynamic information.

The processing element 345 may be embodied in a number of different ways. For example, the processing element 345 may be embodied as a processor, a coprocessor, a controller or various other processing means or devices including integrated circuits such as, for example, an ASIC (application specific integrated circuit) or FPGA (field programmable gate array). In an exemplary embodiment, the processing element 345 may be configured to execute instructions stored in the memory device 350 or otherwise accessible to the processing element 345.

The user interface 355 may be in communication with the processing element 345 to receive an indication of a user input at the user interface 355 and/or to provide an audible, visual, mechanical or other output to the user. As such, the user interface 355 may include, for example, a keyboard, a mouse, a joystick, a touch screen display, a conventional display, a microphone, a speaker, or other input/output mechanisms. In an exemplary embodiment in which the apparatus is embodied as a server, the user interface 355 may be limited, or even eliminated.

The communication interface 360 may be embodied as any device or means embodied in either hardware, software, or a combination of hardware and software that is configured to receive and/or transmit data from/to a network and/or any other device or module in communication with the apparatus 340. In this regard, the communication interface 3360 may include, for example, an antenna and supporting hardware and/or software for enabling communications with network 320, which may be any type of wired or wireless network. Via communication interface 360 and network 320, apparatus 340 can be in communication with exemplary apparatus 300, which, in some exemplary embodiments, also includes various aspects of the present invention.

In an exemplary embodiment, the processing element 345 may be embodied as or otherwise control a decision diagram analyzer 365. The decision diagram analyzer 365 may be any means or device embodied in hardware, software, or a combination of hardware and software that is configured to carry out the functions of the decision diagram analyzer 365 as described herein. In this regard, for example, the decision diagram analyzer 365 (which in an exemplary embodiment may be embodied at a server or other network device) may be configured to receive a query result decision diagram, decode and output query result data from the query result decision diagram, and perform additional queries against the query result decision diagram.

Apparatus 300 may also include a decision diagram analyzer 330. In an exemplary embodiment, the processing element 305 of apparatus 300 may be embodied as or otherwise control a decision diagram analyzer 330. The decision diagram analyzer 330 may be any means or device embodied in hardware, software, or a combination of hardware and software that is configured to carry out the functions of the decision diagram analyzer 330 as described herein. In this regard, for example, the decision diagram generator 330 (which in an exemplary embodiment may be embodied at a server or other network device) may be configured to receive a query result decision diagram, decode and output query result data from the query result decision diagram, and perform additional queries against the query result decision diagram. The description below with respect to decision diagram analyzer 330 of apparatus 340 may be equally applicable to decision diagram analyzer 330 of apparatus 300.

Decision diagram generator 365 may receive the query result decision diagram, from, for example, apparatus 300. Decision diagram generator 365 may receive the query result decision diagram in response to a query instruction transmitted by apparatus 340. Decision diagram analyzer 365 may also receive a dictionary associated with the query result decision diagram.

Upon receipt of the query result decision diagram, decision diagram analyzer 365 may decode the results contained with query result decision diagram. Decision diagram analyzer 365 may decode the results contained within the query result decision diagram using encoding keys contained within a dictionary associated with the query result decision diagram. After decoding the results, the results may be provided to user interface 355 to be output to a user. In embodiments, where apparatus 340 does not include a user interface, the decoded the results may be transferred via a network to a device that may include a user interface for output to a user.

Decision diagram analyzer 365 may also receive additional query instructions after outputting the first set of results. In this regard, a further narrowing of the results set can be performed. In some embodiments, the further narrowing query can be performed locally to an apparatus and no communications with other devices or apparatuses may be necessary. The query instructions can be received via a user interface or via network connection to another device including a user interface.

A query can be performed against the originally received query result decision diagram, using criteria included in the query instruction, to generate a second query result decision diagram. In this regard, the second query result decision diagram can be a subset of the originally received query result decision diagram. To generate the second query result decision diagram, various logical operations, such as the logical-and operation, can be utilized. The query result data associated with this subsequent query may be decoded using the same dictionary that was used to decode the originally received query result decision diagram. The query result data can also be output to a user. Further, subsequent queries may also be performed, that further narrow the results, in the same manner.

Figure 5:
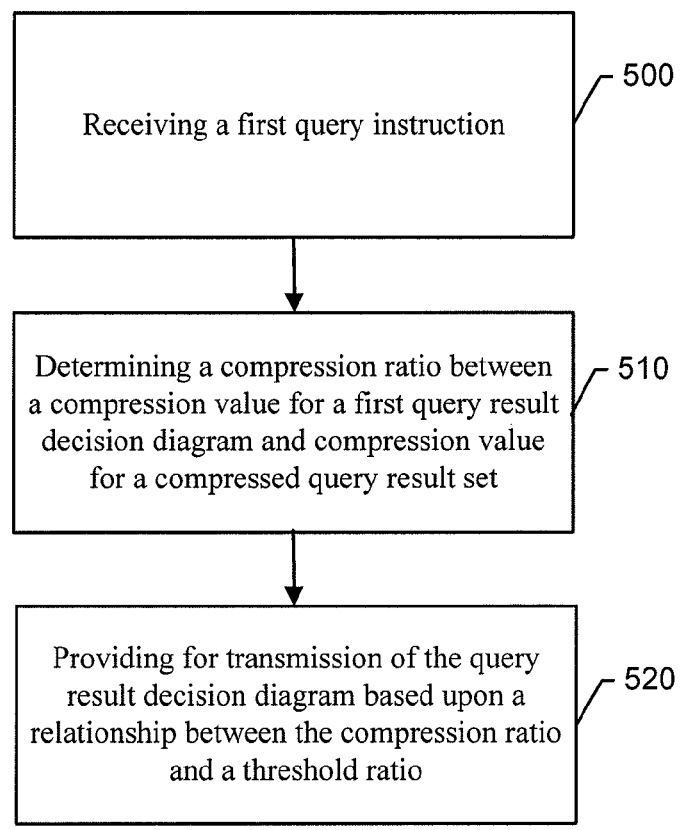
FIG. 5 is a flowchart according to an exemplary method of performing a query using a decision diagram according to an exemplary embodiment of the present invention.
Figure 6:
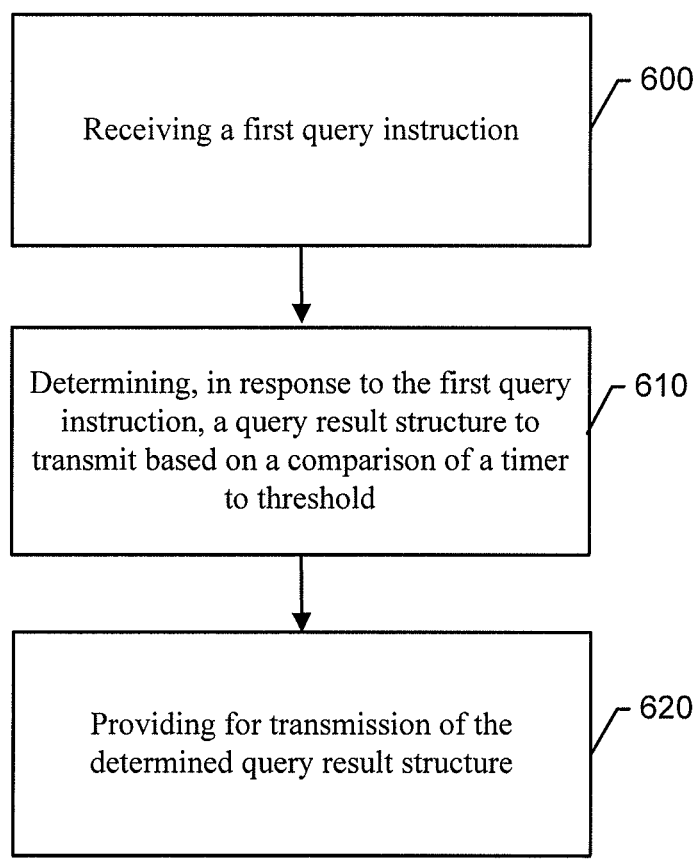
FIG. 6 is a flowchart according to an exemplary method of performing a query using a decision diagram according to an exemplary embodiment of the present invention.

FIGS. 5 and 6 are a flowcharts of a system, method and program product according to exemplary embodiments of the invention. It will be understood that each block or step of the flowcharts, and combinations of blocks in the flowcharts, can be implemented by various means, such as hardware, firmware, and/or software including one or more computer program instructions. For example, one or more of the procedures described above may be embodied by computer program instructions. In this regard, the computer program instructions which embody the procedures described above may be stored by a memory device of an apparatus such as a mobile terminal or server and executed by a built-in processor in the apparatus. As will be appreciated, any such computer program instructions may be loaded onto a computer or other programmable apparatus (i.e., hardware) to produce a machine, such that the instructions which execute on the computer or other programmable apparatus create means for implementing the functions specified in the flowcharts block (s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowcharts block(s) or step(s). The computer program instructions may also be loaded onto a computer or other programmable apparatus to cause a series of operational steps to be performed on the computer or other programmable apparatus to produce a computer-implemented process such that the instructions which execute on the computer or other programmable apparatus provide steps for implementing the functions specified in the flowcharts block(s) or step(s).

Accordingly, blocks or steps of the flowcharts support combinations of means for performing the specified functions, combinations of steps for performing the specified functions and program instruction means for performing the specified functions. It will also be understood that one or more blocks or steps of the flowcharts, and combinations of blocks or steps in the flowcharts, can be implemented by special purpose hardware-based computer systems which perform the specified functions or steps, or combinations of special purpose hardware and computer instructions.

In this regard, one embodiment of a method for performing a query using a decision diagram as provided in FIG. 5 may include receiving a first query instruction at operation 500. The method may further include determining a compression ratio between a compression value for a first query result decision diagram and a compression value for a compressed query result set at operation 510. In some embodiments, determining the compression ratio may include generating the first query result decision diagram based on the first query instruction to facilitate determining the compression value for a first query result decision diagram. Further, in some embodiments, determining the compression ratio may include determining the compression ratio where the first query result decision diagram is a reduced ordered binary decision diagram. The method may further include providing for transmission of the first query result decision diagram based upon a relationship between the compression ratio and the threshold ratio at operation 520.

In some embodiments, determining the compression ratio may further include beginning generation of the first query result decision diagram, beginning generation of the compressed query result set, and starting a timer when the compressed query result set is generated. In these embodiments, providing for transmission of the first query result decision diagram may further include providing for transmission of the first query result decision diagram based on a relationship between the timer and a timer threshold. Alternatively, in some embodiments, starting the timer may occur when the first query result decision diagram is generated.

In an exemplary embodiment, the method may also include additional optional operations. For example, according to various embodiments, the method may further include generating the first query result decision diagram based on the first query instruction and based upon a relationship between the compression ratio and a threshold ratio prior to providing for transmission of the first query result decision diagram. The method may further include generating a dictionary associated with the first query result decision diagram, the dictionary including one or more decoding keys for decoding data in the first query result decision diagram and providing for transmission of the dictionary based upon the relationship between the compression ratio and threshold ratio. In some embodiments, providing for transmission of the dictionary may include providing for transmission of the dictionary based upon a comparison to one or more previously transmitted dictionaries. In such embodiments, generating the dictionary may further include applying a filter to the dictionary. In an exemplary embodiment, the method may also include using the dictionary to decode query result items from the first query result decision diagram.

Various exemplary embodiments may further include additional optional operations. In this regard, the method may further include receiving a second query instruction, and generating a second query result decision diagram based on the second query instruction and the first query result decision diagram.

FIG. 6 depicts another exemplary embodiment of a method for performing a query using a decision diagram. In this regard the method may include receiving a first query instruction at operation 600. The method may further include determining a query result structure to transmit, in response to the first query instruction, based on a comparison of a timer and a timer threshold at operation 610. In some embodiments, the query result structure may be a first query result decision diagram or a compressed query result set. The first query result decision diagram may be a ROBDD and/or the compressed query result set may be a query result data compressed in any conventional manner. The method may also include providing for transmission of the determined query result structure at operation 620.

In some embodiments, comparison of the timer to a timer threshold may include beginning generation of a first query result decision diagram, and beginning generation of a compressed query result set. Additionally, the timer may be started when the compressed query result set is generated or the first query result decision diagram is generated. In some embodiments, comparison of the timer to a timer threshold may include beginning determination of a compression value of the first query result decision diagram, and beginning determination of a compression value of the compressed query result set. In this regard, algorithms may be used to determine either or both compression values. Additionally, the timer may be started when the compression value of the compressed query result set is determined, or when the compression value of the first query result decision diagram is determined. Based on a comparison between the timer and a timer threshold, either the first query result decision diagram or the compressed query result set may be determined for transmission.

In an exemplary embodiment, the method may also include additional optional operations. The method may further include generating a dictionary associated with the first query result decision diagram, the dictionary including one or more decoding keys for decoding data in the first query result decision diagram and providing for transmission of the dictionary if the first query result decision is to be transmitted. In some embodiments, providing for transmission of the dictionary may include providing for transmission of the dictionary based upon a comparison to one or more previously transmitted dictionaries. In such embodiments, generating the dictionary may further include applying a filter to the dictionary. In an exemplary embodiment, the method may also include using the dictionary to decode query result items from the first query result decision diagram.

Various exemplary embodiments may further include additional optional operations. In this regard, the method may further include receiving a second query instruction, and generating a second query result decision diagram based on the second query instruction and the first query result decision diagram.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
   receiving a first query instruction;
   in response to receiving the first query instruction, determining a compression ratio of a first compression value for a first query result decision diagram and a second compression value for a compressed query result set, the first compression value being indicative of a data size of the first query result decision diagram and the second compression value being indicative of the data size of the compressed query result set;
   comparing the compression ratio to a threshold ratio; and
   causing transmission of the first query result decision diagram or causing transmission of the compressed query result set based upon a result of the comparison of the compression ratio to the threshold ratio.

2. A method according to claim 1, wherein determining the compression ratio includes generating the first query result decision diagram based on the first query instruction to facilitate determining the first compression value for a first query result decision diagram and wherein the compressed query result set is compressed using a technique that differs from the use of a decision diagram.

3. A method according to claim 1 further comprising generating the first query result decision diagram based on the first query instruction and based upon a relationship between the compression ratio and a threshold ratio prior to causing transmission of the first query result decision diagram.

4. A method according to claim 1, wherein determining the compression ratio includes:
   beginning generation of the first query result decision diagram,
   beginning generation of the compressed query result set, and
   starting a timer when the compressed query result set is generated; and
   wherein causing transmission of the first query result decision diagram further includes causing transmission of the first query result decision diagram based on a relationship between the timer and a timer threshold.

5. A method according to claim 1, wherein determining a compression ratio includes determining the compression ratio where the first query result decision diagram is a reduced ordered binary decision diagram.

6. A method according to claim 1 further comprising:
   generating a dictionary associated with the first query result decision diagram, the dictionary including one or more decoding keys for decoding data in the first query result decision diagram; and
   causing transmission of the dictionary based upon the relationship between the compression ratio and threshold ratio.

7. A method according to claim 6, wherein generating a dictionary further comprises applying a filter to the dictionary.

8. A method according to claim 6 further comprising using the dictionary to decode query result items from the first query result decision diagram.

9. A method according to claim 1 further comprising:
   receiving a second query instruction; and
   generating a second query result decision diagram based on the second query instruction and the first query result decision diagram.

10. A non-transitory computer-readable storage medium, the computer readable storage medium having computer-readable program code portions stored therein, the computer-readable program code portions comprising:
   a first program code portion configured to receive a first query instruction;
   a second program code portion configured to determine, in response to receiving the first query instruction, a compression ratio of a first compression value for a first query result decision diagram and a second compression value for a compressed query result set, the first compression value being indicative of a data size of the first query result decision diagram and the second compression value being indicative of the data size of the compressed query result set;
   a third program code portion configured to compare the compression ratio to a threshold ratio; and
   a fourth program code portion configured to cause transmission of the first query result decision diagram or cause transmission of the compressed query result set based upon a result of the comparison of the compression ratio to the threshold ratio.

11. A computer-readable storage medium according to claim 10, wherein the second program code portion being configured to determine the compression ratio includes being configured to generate the first query result decision diagram based on the first query instruction to facilitate determining the first compression value for a first query result decision diagram and wherein the compressed query result set is compressed using a technique that differs from the use of a decision diagram.

12. A computer-readable storage medium according to claim 10 further comprising a fifth program code portion configured to generate the first query result decision diagram based on the first query instruction and based upon a relationship between the compression ratio and a threshold ratio prior to execution of the third executable portion.

13. A computer-readable storage medium according to claim 10, wherein the second program code portion configured to determine the compression ratio further includes being configured to:
  begin generation of the first query result decision diagram,
  begin generation of the compressed query result set, and
  start a timer when the compressed query result set is generated; and
  wherein the fourth executable portion being configured to cause transmission of the first query result decision diagram includes being configured to cause transmission of the first query result decision diagram based on a relationship between the timer and a timer threshold.

14. A computer-readable storage medium according to claim 10 further comprising:
  a fifth program code portion configured to generate a dictionary associated with the first query result decision diagram, the dictionary including one or more decoding keys for decoding data in the first query result decision diagram; and
  a sixth program code portion configured to cause transmission of the dictionary based upon the relationship between the compression ratio and threshold ratio.

15. A computer-readable storage medium according to claim 14, wherein the fifth program code portion being configured to generate a dictionary further includes being configured to apply a filter to the dictionary.

16. An apparatus comprising at least one processor and at least one memory including computer program code, the at least one memory and the computer program code configured to, with the at least one processor, direct the apparatus at least to:
  receive a first query instruction;
  determine, in response to receiving the first query instruction, a compression ratio of a first compression value for a first query result decision diagram and a second compression value for a compressed query result set, the first compression value being indicative of a data size of the first query result decision diagram and the second compression value being indicative of the data size of the compressed query result set;
  compare the compression ratio to a threshold ratio; and
  cause transmission of the first query result decision diagram or causing transmission of the compressed query result set based upon a result of the comparison of the compression ratio to the threshold ratio.

17. An apparatus according to claim 16, wherein the apparatus directed to determine the compression ratio includes being directed to generate the first query result decision diagram based on the first query instruction to facilitate determining the first compression value for a first query result decision diagram and wherein the compressed query result set is compressed using a technique that differs from the use of a decision diagram.

18. An apparatus according to claim 16, wherein the apparatus is further directed to generate the first query result decision diagram based on the first query instruction and based upon a relationship between the compression ratio and a threshold ratio prior to causing transmission of the first query result decision diagram.

19. An apparatus according to claim 16, wherein the apparatus directed to determine the compression ratio includes being directed to:
  begin generation of the first query result decision diagram,
  begin generation of the compressed query result set, and
  start a timer when the compressed query result set is generated; and
  wherein the apparatus being directed to cause transmission of the first query result decision diagram includes being directed to cause transmission of the first query result decision diagram based on a relationship between the timer and a timer threshold.

20. An apparatus according to claim 16, wherein the apparatus is further directed to:
  generate a dictionary associated with the first query result decision diagram, the dictionary including one or more decoding keys for decoding data in the first query result decision diagram; and
  cause transmission the dictionary based upon the relationship between the compression ratio and threshold ratio.

21. An apparatus according to claim 20, wherein the apparatus directed to generate a dictionary includes being directed to apply a filter to the dictionary.

22. An apparatus according to claim 20, wherein the apparatus is further caused to use the dictionary to decode query result items from the first query result decision diagram.

23. An apparatus according to claim 16, wherein the apparatus is further directed to:
  receive a second query instruction; and
  generate a second query result decision diagram based on the second query instruction and the first query result decision diagram.

24. An apparatus comprising:
  hardware means for receiving a query instruction;
  hardware means for determining, in response to receiving the first query instruction, a compression ratio of a first compression value for a query result decision diagram and a second compression value for a compressed query result set, the first compression value being indicative of a data size of the query result decision diagram and the second compression value being indicative of the data size of the compressed query result set;
  hardware means for comparing the compression ratio to a threshold ratio; and
  hardware means for causing transmission of the query result decision diagram or causing transmission of the compressed query result set based upon a result of the comparison of the compression ratio to the threshold ratio.

25. An apparatus according to claim 24 further comprising:
  hardware means for generating a dictionary associated with the query result decision diagram, the dictionary including one or more decoding keys for decoding data in the first query result decision diagram; and
  hardware means for transmitting the dictionary based upon the relationship between the compression ratio and the threshold ratio.

* * * * *